(12) United States Patent
Kim et al.

(10) Patent No.: US 7,833,354 B2
(45) Date of Patent: Nov. 16, 2010

(54) MULTIPLE NOZZLE EVAPORATOR FOR VACUUM THERMAL EVAPORATION

(75) Inventors: Seong-Moon Kim, Seoul (KR); Kwang-Ho Jeong, Gyeonggi-do (KR); Myung-Woon Choi, Gyeonggi-do (KR); Hyung-Won Park, Seoul (KR)

(73) Assignee: Yas Co., Ltd., Gyeonggi-Do (KR)

( * ) Notice: Subject to any disclaimer, the term of this patent is extended or adjusted under 35 U.S.C. 154(b) by 377 days.

(21) Appl. No.: 11/814,729

(22) PCT Filed: Jul. 3, 2007

(86) PCT No.: PCT/KR2007/003209

§ 371 (c)(1),
(2), (4) Date: Oct. 26, 2007

(87) PCT Pub. No.: WO2008/004792

PCT Pub. Date: Jan. 10, 2008

(65) Prior Publication Data

US 2009/0229524 A1    Sep. 17, 2009

(30) Foreign Application Priority Data

Jul. 3, 2006  (KR) .................. 10-2006-0061867
Sep. 19, 2006 (KR) .................. 10-2006-0090545
Jul. 2, 2007  (KR) .................. 10-2007-0066024

(51) Int. Cl.
*C23C 16/00* (2006.01)
(52) U.S. Cl. ........................... 118/726
(58) Field of Classification Search .......... 118/726
See application file for complete search history.

(56) References Cited

U.S. PATENT DOCUMENTS

| 5,031,229 | A  | * | 7/1991 | Chow ..................... 392/389 |
| 5,653,813 | A  | * | 8/1997 | Benzing et al. ......... 118/726 |
| 5,803,976 | A  | * | 9/1998 | Baxter et al. ............ 118/726 |
| 6,444,043 | B1 | * | 9/2002 | Gegenwart et al. ..... 118/726 |
| 2005/0183670 | A1 | * | 8/2005 | Grantham et al. ....... 118/726 |

OTHER PUBLICATIONS

U.S. Appl. No. 11/869,289 to Kim et al., which was filed on Oct. 9, 2007.

* cited by examiner

*Primary Examiner*—Michael Cleveland
*Assistant Examiner*—Keath T Chen
(74) *Attorney, Agent, or Firm*—Greenblum & Bernstein, P.L.C.

(57) ABSTRACT

Disclosed is a multiple nozzle evaporator in which a material to be evaporated in the evaporator can be deposited on a substrate with an improved efficiency of use of the material, thereby forming a large-area uniform thin film. The evaporator includes a cylindrical or rectangular post-shaped crucible 31 or 51 with an open top face; and a nozzle unit 32 having a body portion having a cylindrical or rectangular post-like shape with a height smaller than that of the crucible 31 or 51 and assembled to an upper portion of the crucible, and a plurality of evaporation tubes formed at an angle while penetrating through the body portion between top and bottom faces of the body portion. An evaporated material spouts toward peripheral areas of a substrate due to the inclined evaporation tubes, thereby improving the uniformity of a thin film to be deposited and the efficiency of use of the evaporated material, and preventing condensation of the evaporated material at a spouting portion.

6 Claims, 6 Drawing Sheets

[Fig. 1]
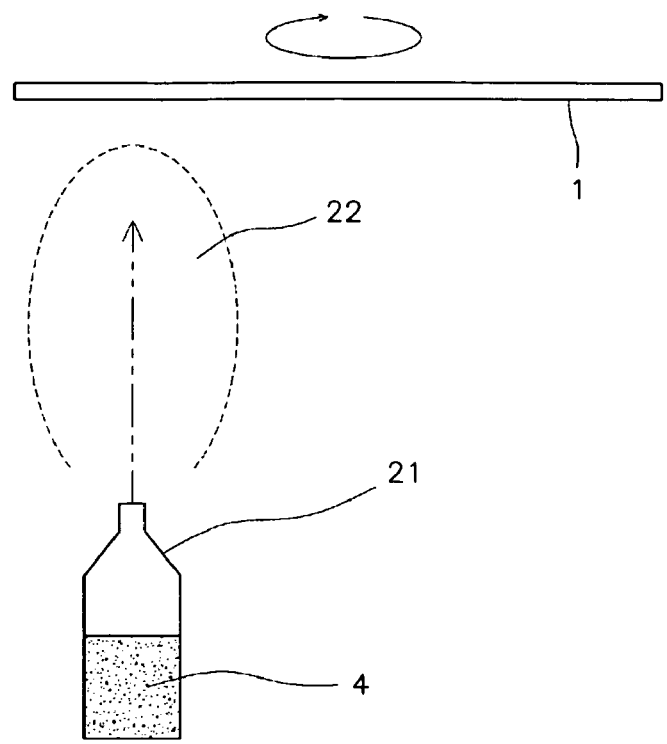
[Fig. 2]
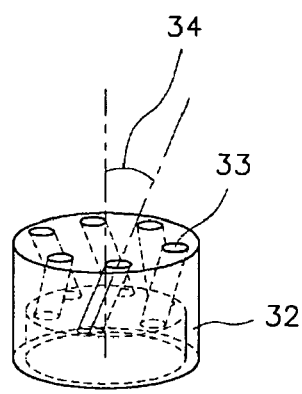
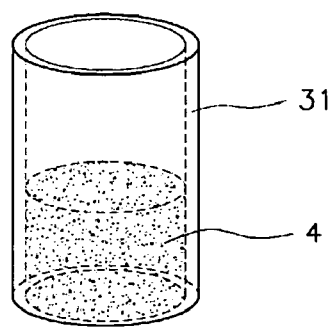

[Fig. 3]
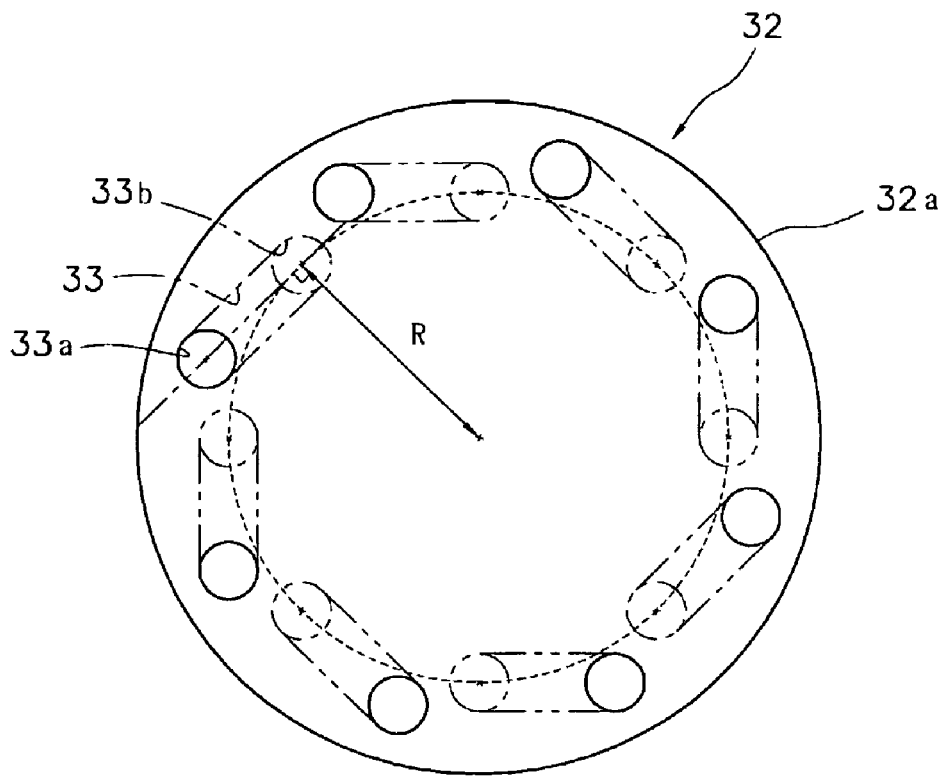
[Fig. 4]
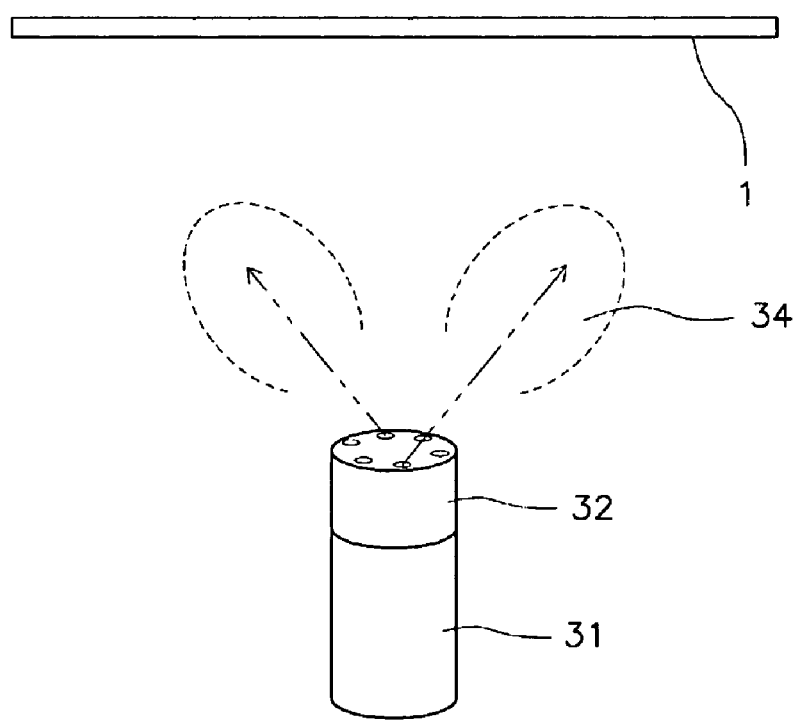

[Fig. 5]
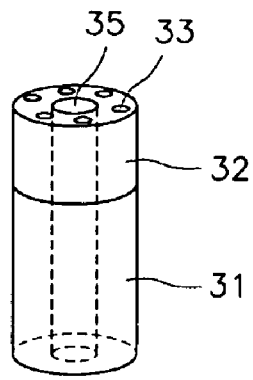
[Fig. 6]
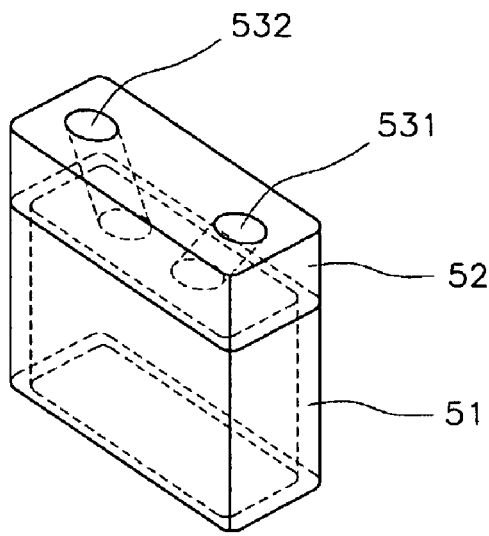
[Fig. 7]
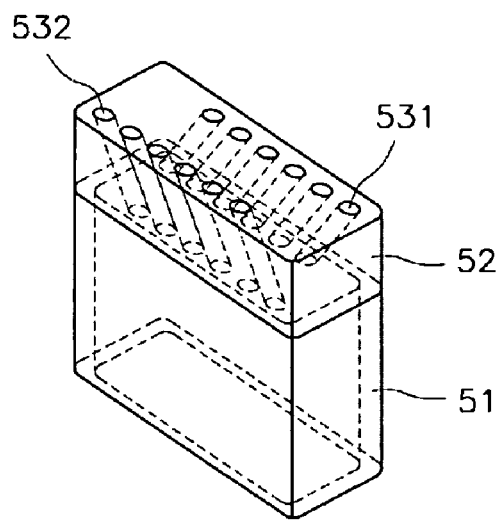

[Fig. 8]
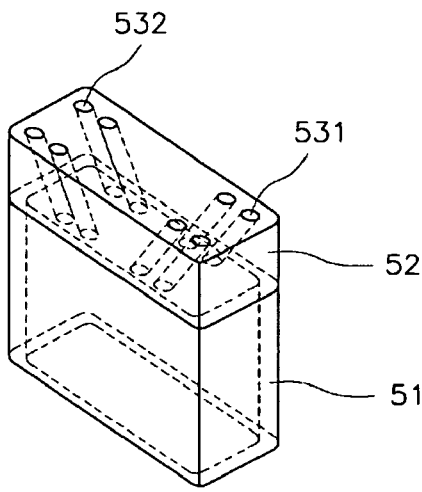
[Fig. 9]
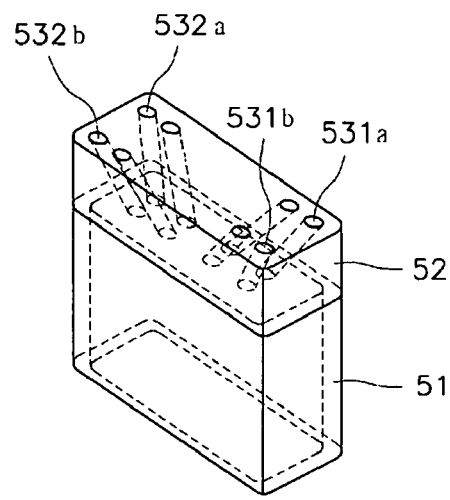
[Fig. 10]
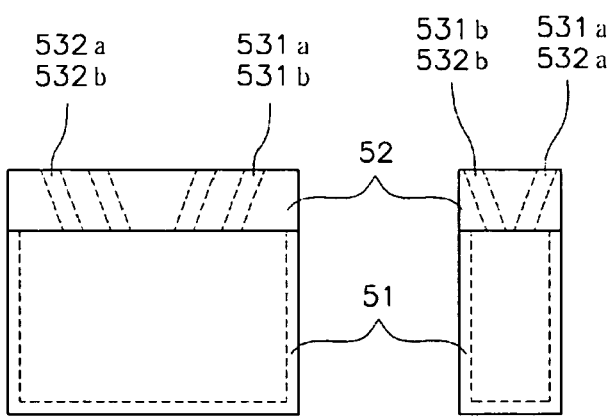

[Fig. 11]
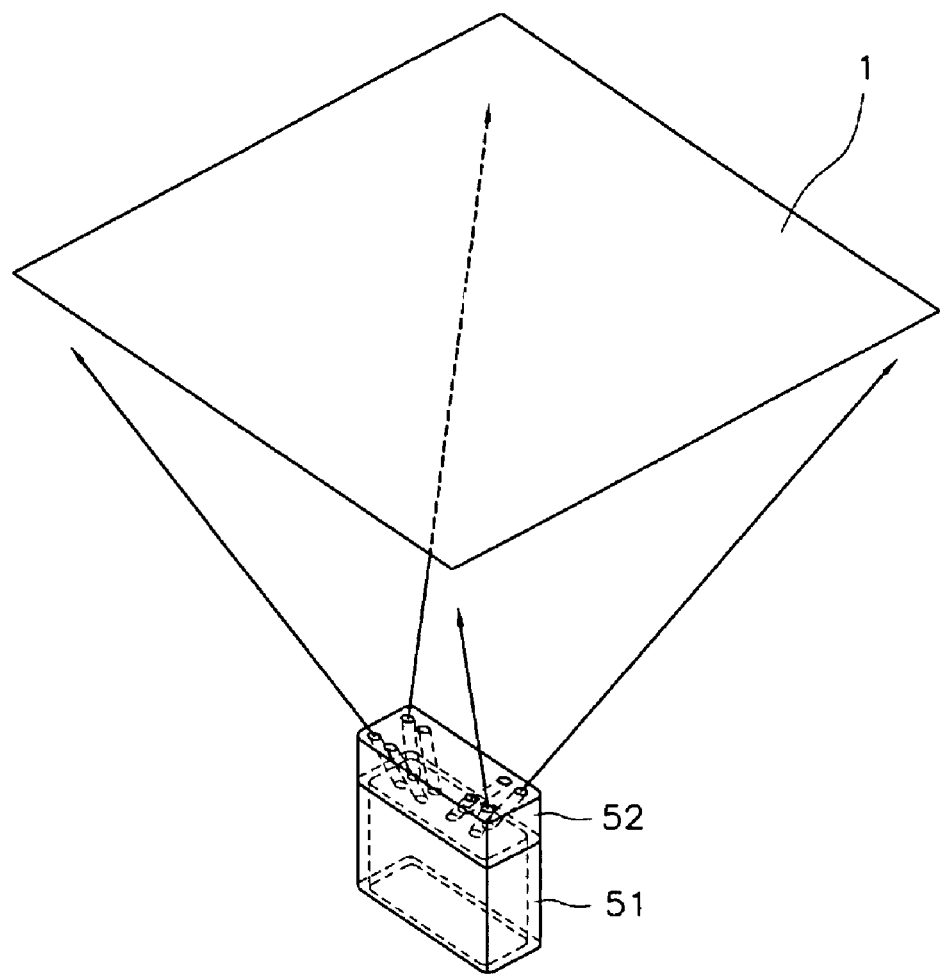
[Fig. 12]
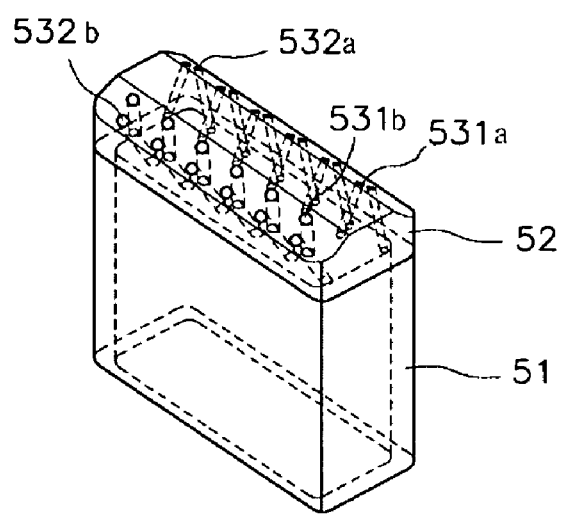

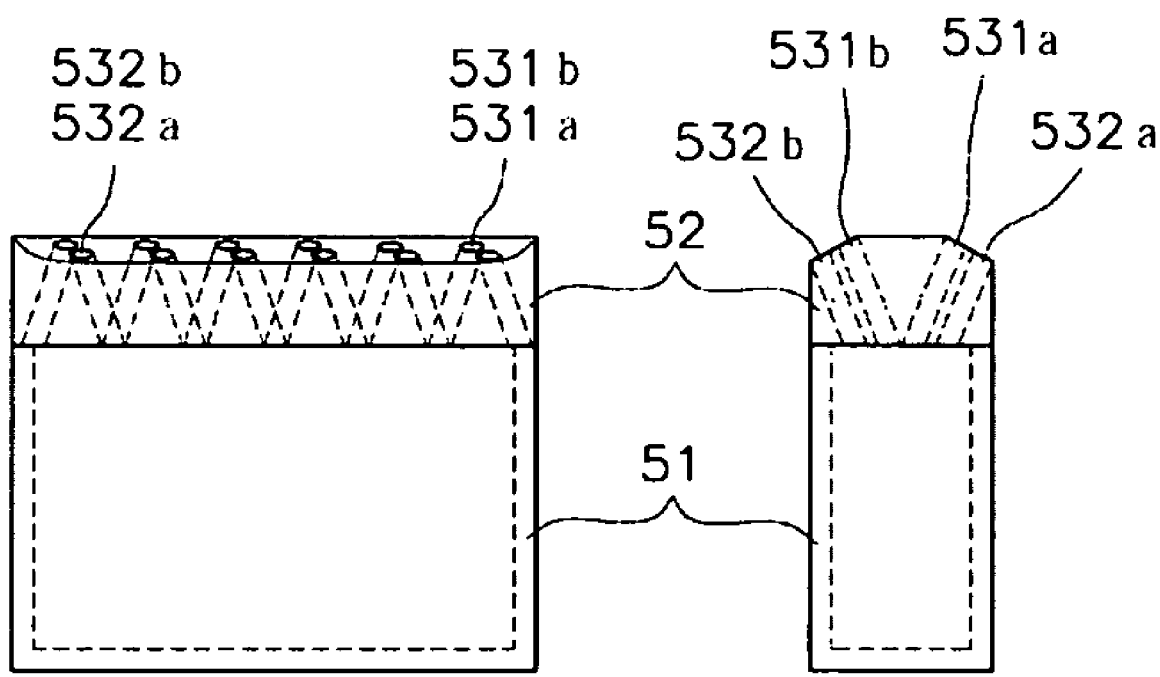
[Fig. 13]

MULTIPLE NOZZLE EVAPORATOR FOR VACUUM THERMAL EVAPORATION

TECHNICAL FIELD

The present invention relates to an evaporator for vacuum thermal evaporation, and more particularly, to a multiple nozzle evaporator in which a material to be evaporated in the evaporator can be deposited on a substrate with an improved efficiency of use of the material, thereby forming a large-area uniform thin film.

BACKGROUND ART

Generally, various thin-film forming techniques are used to fabricate semiconductor devices or flat panel display devices. One of them is a vacuum thermal evaporation method. The vacuum thermal evaporation method is a method of forming a thin film by placing a substrate at an upper side within a vacuum container, and heating an evaporator, which is placed below the substrate and contains a material to be evaporated, so that the evaporated material can be deposited on the substrate.

FIG. 1 shows a point evaporator that is most popularly used in the vacuum thermal evaporation method. As shown in FIG. 1, the point evaporator 21 includes a cylindrical container with a spouting portion. A material to be evaporated is filled into the cylindrical container that in turn is heated to evaporate the material, so that the evaporated material spouts from the container toward a substrate to form a thin film. However, since the point evaporator causes most of the evaporated material to spout therefrom in a direction 22 directed by the spouting portion, it has a problem in that a large-area uniform thin film cannot be obtained. In order to solve this problem, as shown in FIG. 1, an evaporation method in which the point evaporator is placed at a peripheral region of the substrate 1 and the substrate is rotated has been used. However, this evaporation method has further problems in that the addition of an apparatus for rotating the substrate makes the evaporation system complicated and causes defects in final products, and the efficiency of use of a material is lowered.

Moreover, since the spouting portion is located at a center that is far away from a lateral heated portion in the conventional point evaporator, there is a disadvantage in that the evaporated material may be easily condensed at the spouting portion.

In order to solve these problems in the conventional point evaporator, the present inventor proposed a conical-nozzle evaporator. In case of the conical nozzle, it is difficult to achieve a desired spouting distribution, to process the nozzle and to grind the inside of the nozzle. Furthermore, since an evaporation tube is located at the center of the nozzle, there is a disadvantage in that an evaporated material is condensed inside the evaporation tube in the same manner as the conventional point evaporator.

DISCLOSURE OF INVENTION

Technical Problem

Accordingly, the present invention is conceived to solve the aforementioned problems. An object of the present invention is to provide an evaporator which can form a thin film with a uniform thickness on a large-area substrate without rotation of the substrate, improve the efficiency of use of a material to be evaporated, and minimize condensation of the evaporated material.

Technical Solution

According to an aspect of the present invention, there is provided a multiple nozzle evaporator for vacuum thermal evaporation, which comprises a cylindrical crucible with an open top face; and a nozzle unit including a body portion having a cylindrical shape with a height smaller than that of the crucible and assembled to an upper portion of the crucible, and a plurality of evaporation tubes formed at an angle while penetrating through the body portion between top and bottom faces of the body portion, wherein a center of a lower end opening of each of the evaporation tubes in the nozzle unit is located on an identical circumference with a radius from a center of the body portion, and a center of an upper end opening of the evaporation tube is located on a tangential line to the circumference passing through the center of the lower end opening.

According to another aspect of the present invention, there is provided a multiple nozzle evaporator for vacuum thermal evaporation, which comprises a rectangular post-shaped crucible with an open top face; and a nozzle unit including a body portion having a rectangular post-like shape with a height smaller than that of the crucible and assembled to an upper portion of the crucible, and a plurality of evaporation tubes penetrating through the body portion between top and bottom faces of the body portion, wherein the evaporation tubes of the nozzle unit are divided into two groups of which evaporation tubes are inclined in opposite directions at an identical inclination angle with respect to a central axis of the top face of the body portion.

Advantageous Effects

According to the present invention described above, the multiple nozzle evaporator for vacuum thermal evaporation is configured by disposing a plurality of evaporation tubes such that they are directed to peripheral areas of a substrate. Thus, a uniform thin film can be formed on a large-area substrate, the efficiency of use of a material to be evaporated can be improved, and the evaporated material can be prevented from being condensed on the evaporation tubes.

BRIEF DESCRIPTION OF THE DRAWINGS

FIG. 1 is a schematic view illustrating a vacuum thermal evaporation method using a conventional point evaporator.

FIG. 2 is a perspective view showing a multiple nozzle evaporator according to a first embodiment of the present invention.

FIG. 3 is a plan view of a nozzle unit in the multiple nozzle evaporator according to the first embodiment of the present invention.

FIG. 4 is a schematic view illustrating a vacuum thermal evaporation method using the first embodiment of the present invention.

FIG. 5 is a perspective view showing a second embodiment of the present invention.

FIG. 6 is a perspective view showing a third embodiment of the present invention.

FIGS. 7 and 8 are perspective views showing variants of the third embodiment of the present invention.

FIGS. 9 and 10 show a perspective view and front and side views illustrating a fourth embodiment of the present invention, respectively.

FIG. 11 is a schematic view illustrating a vacuum thermal evaporation method using the fourth embodiment of the present invention.

FIGS. 12 and 13 show a perspective view and front and side views illustrating a variant of the fourth embodiment of the present invention, respectively.

BEST MODE FOR CARRYING OUT THE INVENTION

Hereinafter, preferred embodiments of the present invention will be described in detail with reference to the accompanying drawings.

A multiple nozzle evaporator of the present invention can be implemented in two different ways according to configurations of a crucible and a nozzle unit of the evaporator. A type of multiple nozzle evaporator is a circular multiple nozzle evaporator that has a circular crucible and a circular nozzle unit and corresponds to first and second embodiments of the present invention. Another type of multiple nozzle evaporator is a rectangular multiple nozzle evaporator that has a rectangular crucible and a rectangular nozzle unit and corresponds to third and fourth embodiments of the present invention.

Referring to FIGS. 2 and 3, the multiple nozzle evaporator for vacuum thermal evaporation according to the present invention includes a crucible 31 and a nozzle unit 32.

The crucible 31 is formed of a cylindrical container that has an open top face and can receive a material 4 to be evaporated therein. A coupling means for use in coupling with the nozzle unit is formed at an upper portion of the crucible 31.

The nozzle unit 32 includes a body portion 32a having a cylindrical shape with a height smaller than that of the crucible 31 and assembled to the upper portion of the crucible 31, and a plurality of evaporation tubes 33 formed at an angle while penetrating through the body portion 32a between top and bottom faces of the body portion 32a.

A coupling means for use in coupling with the upper portion of the crucible 31 is provided at a lower portion of the nozzle unit 32.

The coupling means for coupling the nozzle unit with the crucible may be constructed of snap-fit protrusions provided at peripheries of the crucible and the nozzle unit where they are coupled with each other. Alternatively, the coupling means may be constructed of clamps or the like provided respectively at the crucible and the nozzle unit.

In particular, the center of a lower end opening 33b of each of the evaporation tubes 33 is located on an identical circumference with a radius R from the center of the body portion, and the center of an upper end opening 33a of the evaporation tube 33 is located on a tangential line to the circumference passing through the center of the lower end opening 33b.

It is preferred that each of the evaporation tubes 33 be formed at an angle of less than about 60 degrees with respect to the vertical direction of the body portion 32a.

To perform vacuum thermal evaporation on a substrate 1 using the first embodiment of the present invention, the multiple nozzle evaporator of the present invention is placed below a center of the substrate 1, as shown in FIG. 4. Then, the evaporator is heated so that a material to be evaporated is evaporated and spouts through the inclined evaporation tubes 33 toward lateral sides of the substrate and is finally deposited on the substrate.

When vacuum thermal evaporation is performed using the multiple nozzle evaporator for vacuum thermal evaporation according to the present invention, the evaporated material spouts toward the peripheral areas of the substrate by means of the evaporation tubes inclined to be directed to the peripheral areas, resulting in a thin film with a uniform thickness even in case of a large-area substrate. Since the evaporator is placed below the center of the substrate, it is possible to minimize the amount of the material to be wasted by being directed to the outside of the substrate. In addition, the structure and inclination angle of the evaporation tube can be optimally adjusted according to process conditions so as to optimize the uniformity of a thin film and the efficiency of use of the material.

The evaporation tube 33 may be constructed to be inclined toward the outside of the nozzle unit from a center line of the nozzle unit (i.e., in a direction toward an outer periphery of a top face of the nozzle unit from the center of the bottom face of the nozzle unit).

Since the evaporation tubes are configured as above, they can be disposed more densely. Thus, it is possible to obtain effects similar to those obtained in a case where nozzles are consecutively disposed. In addition, since the entire evaporation tubes are formed near the outer periphery of the nozzle unit, better thermal conduction can be achieved and it is possible to prevent condensation of the evaporated material within the evaporation tubes.

Furthermore, a protrusion or inclined surface may be formed on the top face of the body portion 32a of the nozzle unit in order to properly control the spouting distribution of the material that spouts through each of the evaporation tubes. Alternatively, the diameter of the evaporation tube may vary along the length thereof, or a protrusion may be formed within the evaporation tube.

FIG. 5 shows a perspective view of a second embodiment of the present invention.

In this embodiment, a hollow portion 35 is formed along central portions of the nozzle unit 32 and the crucible 31, so that a central heater can be additionally installed in the hollow portion. The central heater enhances the heating capacity of the evaporator and also mainly heats the nozzle unit to prevent the evaporated material from being condensed within the evaporation tubes.

Referring to FIGS. 6 to 8, a multiple nozzle evaporator according to a third embodiment of the present invention includes a rectangular crucible 51 and a rectangular nozzle unit 52. The crucible 51 is formed of a rectangular container that has an open top face and can receive a material to be evaporated therein. A coupling means for use in coupling with the nozzle unit is formed at an upper portion of the crucible.

The coupling means for coupling the nozzle unit with the crucible may be constructed of snap-fit protrusions provided at peripheries of the crucible and the nozzle unit where they are coupled with each other. Alternatively, the coupling means may be constructed of clamps or the like provided respectively at the crucible and the nozzle unit.

The nozzle unit 52 is formed with a plurality of evaporation tubes 531 and 532 extending from a top face to a bottom face of the nozzle unit. In particular, as a technical feature of this embodiment, the evaporation tubes are inclined in opposite directions and thus divided into two groups 531 and 532 according to the inclined directions, so that the deposited material can be directed to the peripheral areas of the substrate.

Each of the groups may include a single evaporation tube as shown in FIG. 6, a single row of evaporation tubes as shown in FIG. 7, or a cluster of two rows of evaporation tubes as shown in FIG. 8.

In order to properly control the spouting distribution of the evaporated material spouting through each of the evaporation tubes, a protrusion or inclined surface may be formed on a top face of the body portion of the nozzle unit. Alternatively, the diameter of the evaporation tube may vary along the length thereof, or a protrusion may be formed within the evaporation tube.

When the evaporator of the third embodiment is used for vacuum thermal evaporation of the material on the substrate positioned above the evaporator, the two groups of evaporation tubes are directed to the peripheral areas of the substrate, and thus, a combination of the spouting distributions of the evaporated material spouting through the two groups of evaporation tubes can achieve a uniform distribution in the longitudinal direction of the evaporator. The structures and inclination angles of the evaporation tubes can be properly adjusted to achieve a spouting distribution that enables better uniformity of vacuum thermal evaporation and a higher efficiency of use of the material.

Since the third embodiment enables uniform vacuum thermal evaporation only in the longitudinal direction of the evaporator, it is preferred that vacuum thermal evaporation using the evaporator of the third embodiment be performed by moving the substrate or evaporator in a direction perpendicular to the length of the evaporator.

Referring to FIGS. 9 to 11, contrary to the third embodiment, a fourth embodiment of the present invention includes four groups 531a, 531b, 532a and 532b of evaporation tubes in a nozzle unit. That is, the evaporation tubes are divided into two main groups each of which is again divided into two sub-groups, thereby generating the four groups in total. The two main groups 531 and 532 are inclined outwardly in the longitudinal direction of the evaporator, and the two sub-groups 531a and 531b or 532a and 532b of each of the main groups are inclined toward peripheral areas of a substrate in a direction perpendicular to the longitudinal direction of the evaporator while being inclined outwardly in the longitudinal direction of the evaporator.

As more clearly understood from FIG. 11 illustrating a vacuum thermal evaporation method, the four groups are inclined toward respective four corners of the substrate 1 positioned above the evaporator.

Further, referring to FIGS. 12 and 13, each group of evaporation tubes in a nozzle unit includes a plurality of evaporation tubes in a row. Alternatively, each group of evaporation tubes may include a cluster of two rows of evaporation tubes, as shown in FIG. 9. As another alternative, the evaporation tubes may be arranged into four groups.

In order to properly control the spouting distribution of the evaporated material spouting through each of the evaporation tubes, a protrusion or inclined surface may be formed on a top face of a body portion of the nozzle unit. Alternatively, the diameter of the evaporation tube may vary along the length thereof, or a protrusion may be formed within the evaporation tube.

In the fourth embodiment that has been advanced from the third embodiment, the structures and inclination angles of the evaporation tubes are adjusted appropriately so as to achieve a spouting distribution of a material, which enables uniform vacuum thermal evaporation in the longitudinal direction of the evaporator as well as in the direction perpendicular to the longitudinal direction. Contrary to the third embodiment, vacuum thermal evaporation can be carried out with both the evaporator and the substrate held in place. In addition, since the substrate generally has a rectangular shape, the fourth embodiment can provide a higher efficiency of use of a material as compared with the first and second embodiments which provide a circular spouting distribution of a material.

Furthermore, in order to minutely control the spouting distribution in the respective embodiments of the present invention, an additional group of vertical evaporation tubes may be further provided, or a sub-group of evaporation tubes having a different inclination angle may be added.

The embodiments are merely examples specifically illustrating the technical spirit of the present invention. The scope of the invention is not limited to the embodiments or the drawings.

The invention claimed is:

1. A multiple nozzle evaporator for vacuum thermal evaporation, the evaporator comprising:
   a rectangular post-shaped crucible with an open top face; and
   a nozzle unit including a body portion having a rectangular post-like shape with a height smaller than that of the crucible and secured to an upper portion of the crucible, and a plurality of evaporation tubes penetrating through the body portion between top and bottom faces of the body portion, wherein the evaporation tubes of the nozzle unit are divided into two groups each group including a plurality of evaporation tubes with the evaporation tubes of one of the two groups being inclined in an opposite direction with respect to the evaporation tubes of the other group, the evaporation tubes of each group extending at an identical inclination angle with respect to a central planar axis and extending away from the central planar axis of the top face of the body portion.

2. The multiple nozzle evaporator according to claim 1, wherein the evaporation tubes of the nozzle unit consist of the two groups.

3. The multiple nozzle evaporator according to claim 1, wherein the nozzles of each of the groups extend parallel to opposite sides of the rectangular post like shape of the nozzle unit.

4. The multiple nozzle evaporator according to claim 1, wherein lines defined by intersections of the evaporation tubes of each group with the top and with the bottom faces of the body portion are parallel to each other.

5. The multiple nozzle evaporator according to claim 1, wherein an angle of inclination between the top and bottom faces of the body portion, for each of the evaporation tubes within each of the groups, is equal.

6. The multiple nozzle evaporator according to claim 1, wherein all of the evaporation tubes provided in the body portion are inclined with respect to the central planar axis of the top face of the body portion.

* * * * *